United States Patent
Kay et al.

(10) Patent No.: US 7,279,906 B2
(45) Date of Patent: Oct. 9, 2007

(54) SENSOR-EMULATOR EVALUATION MODULE AND METHOD

(76) Inventors: Arthur A. Kay, 2433 W. Hidden View Pl., Tucson, AZ (US) 85742; Timothy H. Green, 1161 N. Chamberlain Pl., Tucson, AZ (US) 85745

( * ) Notice: Subject to any disclaimer, the term of this patent is extended or adjusted under 35 U.S.C. 154(b) by 141 days.

(21) Appl. No.: 11/215,788

(22) Filed: Aug. 30, 2005

(65) Prior Publication Data

US 2007/0046300 A1 Mar. 1, 2007

(51) Int. Cl.
*G01R 27/02* (2006.01)
(52) U.S. Cl. .................. 324/610; 324/706
(58) Field of Classification Search ......... 324/610, 324/670, 685, 706, 721, 725
See application file for complete search history.

(56) References Cited

U.S. PATENT DOCUMENTS 5,461,322 A * 10/1995 Bey et al. .................. 324/706
2005/0256660 A1* 11/2005 Laraia et al. ............... 702/107

* cited by examiner

*Primary Examiner*—Vincent Q. Nguyen

(57) ABSTRACT

A bridge sensor emulator includes a first emulation circuit programmable to emulate an output signal of the bridge circuit under 11 conditions each including a different combination of applied stimulus and temperature. A second emulation circuit is programmable to emulate the temperature-sensing device for 3 temperatures. An excitation signal is applied to the first emulation circuit. One rotary switch is coupled to the first emulation circuit to select from it and emulate a bridge output signal. An emulated common mode sensor output voltage is also generated. Another rotary switch is coupled to the second emulation circuit to select from it and emulate one of three temperature output signals. In another embodiment, a microcontroller, nonvolatile memory, and three digital to analog converters are utilized to emulate the bridge sensor for the 11 conditions.

20 Claims, 10 Drawing Sheets

SENSOR-EMULATOR EVALUATION MODULE AND METHOD

BACKGROUND OF THE INVENTION

The present invention relates generally to systems and methods for accurately and rapidly characterizing bridge sensors so they can be promptly used for design and/or development for various applications.

FIG. 1A shows a typical bridge sensor 49A wherein the temperature coefficient of a Wheatstone bridge sensor including bridge resistors 50, 51, 52 and 53 is used to develop a temperature-dependent voltage across a temperature-sensing resistor Rt. The voltage across temperature-sensing resistor Rt is referred to as the "temperature signal" Vtemp. An excitation voltage Vexc is applied to the junction 17 between resistors 50 and 51. Temperature-sensing resistor Rt is connected between ground and the junction 57 between resistors 52 and 53, and is considered to be connected at the "bottom" of bridge sensor 49A. A bridge sensor output signal Vsensorout+ is produced at the junction 55 between resistors 51 and 53, and another bridge sensor output signal Vsensorout− is produced at the junction 56 between resistors 50 and 52. The differential output of the bridge sensor is equal to Vsensorout+ minus Vsensorout−.

It should be understood that one or more of the resistors 50, 51, 52 and 53 is a transducer, the resistance of which is modulated by an applied stimulus, such as pressure, torque, humidity or the like. The modulated resistance of such a transducer results in a variation in the bridge sensor output signal.

FIG. 1B shows a another typical bridge sensor 49B wherein the temperature coefficient of the Wheatstone bridge sensor is used to develop a voltage across temperature-sensing resistor Rt. As in FIG. 1A, voltage across temperature-sensing resistor Rt is the "temperature signal" Vtemp. In FIG. 1B, an excitation voltage Vexc is applied to one terminal of temperature-sensing resistor Rt, the other terminal of which is connected to the junction 54 between resistors 50 and 51. Temperature-sensing resistor Rt is considered to be connected at the "top" of bridge sensor 49B. A sensor output signal Vsensorout+ is produced at the junction 55 between resistors 51 and 53, and another bridge sensor output voltage Vsensorout+ is produced at the junction 56 between resistors 50 and 52.

FIG. 1C shows a bridge sensor 49C in which the Wheatstone bridge section is in close thermal contact with a diode D through which a current I is forced by an external current source. The current I is forced into the anode of diode D, the cathode of which is connected to ground. The forward voltage across diode D is the "temperature signal" Vtemp. Excitation voltage Vexc is applied to the junction 17 between resistors 50 and 51. The bridge sensor output signal Vsensor-out(+) is produced at the junction 55 between resistors 51 and 53, and another sensor output signal Vsensorout+ is produced at the junction 56 between resistors 50 and 52.

It is desirable to emulate bridge sensors such as those of FIGS. 1A-C because large amounts of time are required to perform the needed calibration of the bridge sensor signal conditioning system that is required before the bridge sensor can be optimally used in designing a user system that requires bridge sensor input signals. Typically, a single calibration cycle for a bridge sensor in an environmental chamber/oven at a single temperature, including times required for the temperature to completely settle, can be approximately 8 hours. (It should be appreciated that the term "calibration" refers to the situation wherein the sensor is used in conjunction with development and/or programming of a "sensor signal conditioning system". Sensor signal conditioning systems typically are programmable so as to cancel out both the temperature drift of the sensor and nonlinearity of the bridge sensor with respect to its applied stimulus. The term "characterization" refers to the process wherein measurements are made of the bridge sensor which exhibit both the nonlinearity of the bridge sensor with respect to its applied stimulus and the temperature drift of the bridge sensor.)

Typically, a customer may want to develop an application solution that needs to utilize the signals produced by a bridge sensor. Typically, the output signal produced by a bridge sensor is quite nonlinear with respect to a applied stimulus, such as pressure, torque, or other parameter. The bridge sensor output signal typically also varies or drifts considerably with respect to temperature. Also, bridge sensors often have non-repeatability or hysteresis problems.

A bridge sensor typically produces a low level output signal, e.g., in millivolts which is quite nonlinear with respect to the applied stimulus and which drifts over a temperature range. That small, nonlinear, temperature-dependent bridge sensor output signal often needs to be amplified and converted to a linear, temperature-independent, large-magnitude output signal in the range of, e.g., 0 to 5 volts. Typically, a sensor signal conditioning chip or system is utilized to solve these problems. However, sensor signal conditioning chips typically are complicated systems, and the user may need to learn to use software associated with the calibration of a bridge sensor or write software and/or develop hardware that involves a sensor signal conditioning chip and associated circuitry. The software referred to often is available for various sensor signal conditioning chips that are commercially available. The manufacturers of the various sensor signal conditioning chips typically either provide such software or provide instructions to customers on how to generate the software themselves.

Typically, the bridge sensor and the associated hardware must be placed in an environmental chamber/oven and thermally cycled to various temperatures at which the bridge sensor signal conditioning chip needs to be calibrated, and the proper coefficients need to be determined and stored into the sensor signal conditioning chip to compensate the various nonlinearities and drifts of the bridge sensor.

It should be appreciated that the amount of time required for cycling the temperature of the bridge sensor from cold to room temperature and from room temperature to hot in an environmental chamber/oven is the main factor that makes calibration/characterization of a bridge sensor very time-consuming. This is because it may require quite a few hours for the oven temperature, and hence the bridge sensor temperature, to fully stabilize. A typical three point calibration (−55 degrees C., 25 degrees C., and 85 degrees C.) for example, could require as much as eight or more hours to perform.

Another difficulty in working with bridge sensors is that in some cases costly specialized test equipment is required to provide the stimulus required to characterize the bridge sensors (e.g., stimulus such as humidity, acceleration, pH, pressure, strain, etc.). In many cases, access to such specialized test equipment is limited or unavailable. Furthermore, the equipment that provides the real world applied stimulus is sometimes custom developed for a specific bridge sensor and as such may be unproven.

The design/development of a system including bridge sensor signal conditioning electronics and its associated calibration software can be a difficult and time-consuming task. It would be highly desirable to have a device that could rapidly characterize bridge sensors and thereby substantially reduce the time required for the initial design stages in developing systems that utilize bridge sensors. For example, if a developer were to encounter non-repeatability errors while working on development of a sensor signal conditioning system while using a bridge sensor as the signal source, the developer would not know if the non-repeatability errors were caused by the bridge sensor, by the bridge sensor applied stimulus source (e.g. accelerometer, or pressure source), or by the bridge sensor signal conditioning system. In some cases, engineers have limited access to the hardware/software involved. In other cases this equipment is being developed in parallel with the sensor signal conditioning system and consequently is not available for use. It would be very advantageous to the developer to be able to have true picture of the accuracy and capability of a bridge sensor signal conditioning system apart from or independently of repeatability problems associated with the bridge sensor.

There is an unmet need for a system and method that greatly reduces the amount of time required for development of a sensor signal conditioning system.

There also is an unmet need for a system and method that avoids the large amount of time required for calibration cycles of bridge sensors during development of a sensor signal conditioning system.

There also is an unmet need for system and method that enables a developer to rapidly de-bug bridge sensor calibration software and hardware associated with sensor signal conditioning systems.

There also is an unmet need for a system and method that can eliminate non-repeatability problems of bridge sensors during the development of an associated sensor signal conditioning system.

There also is an unmet need for a system and method which can allow a developer to get a true picture of the accuracy and capability of a bridge sensor signal conditioning system without directly utilizing a bridge sensor to allow the developer to focus on issues with the sensor signal conditioning system separately or independently from problems with the bridge sensor.

SUMMARY OF THE INVENTION

It is an object of the invention to provide a system and method that greatly reduce the amount of time required to develop a sensor signal conditioning system for a Wheatstone bridge sensor.

It is another object of the invention to provide a method for evaluation of errors in the sensor signal conditioning system separately from or independently of the bridge sensor and its applied stimulus source (e.g. acceleration, pressure) in order to eliminate non-repeatability errors of bridge sensors to allow).

It is another object of the invention to provide an alternative to using expensive, custom designed sensor applied stimulus sources during development of the sensor signal conditioning system.

It is another object of the invention to provide an alternative to using expensive, custom designed sensor applied stimulus sources during development of the sensor signal conditioning system.

Briefly described, and in accordance with one embodiment, the present invention provides a system for emulating a bridge sensor including a bridge circuit and a temperature-sensing device (Rt or D), including a first emulation circuit (2) programmable to emulate an output signal of the bridge circuit under a first number of conditions, each condition including a different combination of a selected applied stimulus level and a selected temperature of the bridge circuit, and a second emulation circuit (22 or 25) programmable to emulate the temperature-sensing device (Rt or D) for a second number of temperatures, an excitation signal (Vexc) being applied to the first emulation circuit (2). A first selector circuit (12,20) coupled to the first emulation circuit (2) produces a first emulated bridge output signal (Sensorout+) representative of a selected one of the first number of conditions. An emulated common mode sensor output voltage (Sensorout−) also is generated. A second selector circuit (23) coupled to the second emulation circuit (22 or 25) produces a first emulated temperature output signal (Vtemp) representative of a selected one of the second number of temperatures.

In one embodiment, the first emulation circuit (2) includes a first number of resistive channels (CH1-11) corresponding to the first number of conditions, respectively, wherein each channel of the first number of resistive channels includes a first resistive divider circuit (R1,R2,R3,R4) which is programmable to emulate a bridge sensor voltage corresponding to a different one of the first number of conditions. The second emulation circuit (22 or 25) includes a second number of resistive channels to emulate the temperature-sensing device for the second number of temperatures, wherein each channel of the second number of resistive channels includes a second resistive divider circuit which is programmable to emulate a temperature-sensing device voltage (Vtemp) corresponding to a different one of the second number of temperatures. In a described embodiment, each of the first number of resistive channels (CH1-11) includes a first resistor (R1), a first potentiometer (R2), a second potentiometer (R3), and a second resistor (R4) coupled in series between the excitation signal circuit (15, 16) and a reference ground conductor (8), and a wiper of the first potentiometer (R2) is coupled to conduct a signal representative of a corresponding one of the first number of conditions associated with that resistive channel to an input of the output circuit (12,20).

The temperature-sensing device of the bridge sensor to be emulated may include either a temperature-sensing resistor (Rt) coupled to the bridge circuit or a temperature-sensing diode (D) in close thermal coupling with the bridge circuit, and wherein the second emulation circuit (25) is programmable to emulate the temperature-sensing resistor (Rt) for the second number of temperatures. The bridge sensor also includes a third emulation circuit (22) programmable to emulate the temperature-sensing diode (D) for the second number of temperatures.

The second emulation circuit (25) is programmable to emulate the temperature-sensing resistor (Rt) for the second number of temperatures and includes a number of resistive channels (CH1-3) equal to the second number, wherein each channel of the second emulation circuit (25) includes third (R10) and fourth (R13) resistors and third (R11) and fourth (R12) potentiometers coupled in series between the excitation signal circuit (15,16) and the reference ground conductor (8), and wherein a terminal of the fourth resister (R13) is coupled to the second output circuit (23), the first emulated temperature output (Vtemp) controlling a reference ground voltage on the reference ground conductor (8). The third emulation circuit (22) is programmable to emulate the temperature-sensing diode (D) for the second number of temperatures and includes a number of resistive channels (CH1-3) equal to the second number, wherein each channel of the third emulation circuit (22) includes a fifth resistor (R7) and fifth (R8) and sixth (R9) potentiometers coupled in series between a ground conductor and the second output circuit (23).

In a described embodiment, the first selector circuit (12) includes a first rotary switch having a first terminal (13) coupled to an input of the output buffer (20) and a number of selectable terminals equal to the first number coupled to the plurality of adjustable voltage terminals of the first emulation circuit (2). The second selector circuit (23) includes a second rotary switch having a selector terminal coupled to the first terminal (18) of the second selector circuit (23) and a number of selectable terminals coupled to the plurality of adjustable voltage terminals in the second (25) and third (22) emulation circuits, respectively, representative of the second number of temperatures. The bridge sensor emulating system (1) is coupled to a sensor signal conditioning chip to allow the bridge sensor emulating system (1) under development to function as a signal source during the development, whereby the bridge sensor emulator can rapidly emulate various conditions to aid in the development.

In another embodiment, a bridge sensor is emulated by providing a first number of stored voltage variables each corresponding to a different selected condition, wherein each condition includes a different combination of selected applied stimulus level and selected temperature of the bridge circuit. Each of the first number of stored voltage variables is programmed to emulate a bridge sensor voltage corresponding to a different one of the first number of conditions by setting that stored voltage variable to a voltage value representative of a first sensor output voltage (Vsensor+) for the bridge sensor to be emulated for each of the first number of conditions, respectively. A second number of stored voltage variables is provided, each corresponding to a number of different selected temperatures of the bridge circuit equal to the second number. Each of the second number of stored voltage variables are programmed to emulate a different bridge circuit temperature voltage across the temperature-sensing device of the bridge sensor to be emulated by setting that stored voltage variable to a voltage value representative of the corresponding selected bridge circuit temperature. A bridge sensor output voltage corresponding to a selected one of the first number of conditions is emulated by converting, by means of a digital to analog converter, a corresponding one of the stored voltage variables to an analog sensor output voltage representing the bridge sensor output voltage (Sensorout+). The bridge sensor temperature voltage corresponding to a selected one of the second number of bridge sensor temperature voltages is emulated by converting, by means of another digital to analog converter, a corresponding one of the stored temperature voltage variables to an analog temperature voltage representing the bridge sensor temperature bridge temperature voltage (Vtemp).

DETAILED DESCRIPTION OF THE PREFERRED EMBODIMENTS

At the outset, it should be understood that the bridge sensor emulator of the present invention is a tool for development of sensor signal conditioning chips or systems. The purpose of a sensor signal conditioning chip/system is to couple a bridge sensor to a user system such a way as to automatically compensate nonlinearity and drift of the bridge sensor so that it appears as an ideal, linear, drift-free bridge sensor. Before a bridge sensor can be emulated, it must be characterized, and that can be accomplished only by placing the bridge sensor into an environmental chamber/oven, applying appropriate stimulus to the bridge sensor at various temperatures, and making appropriate measurements of the sensor responses. After the results of the characterization of the bridge sensor are available, for example from a bridge sensor data sheet, to a person who is developing a sensor signal conditioning system that information can be used to program the bridge sensor emulators of the present invention. Then the bridge sensor emulators, rather than the real bridge sensor, can be connected to the sensor signal conditioning system being developed and used to emulate the real bridge sensor over a desired range of temperatures, without having to wait for stabilizing of bridge sensor temperatures in an environmental chamber/oven.

Figure 2A:
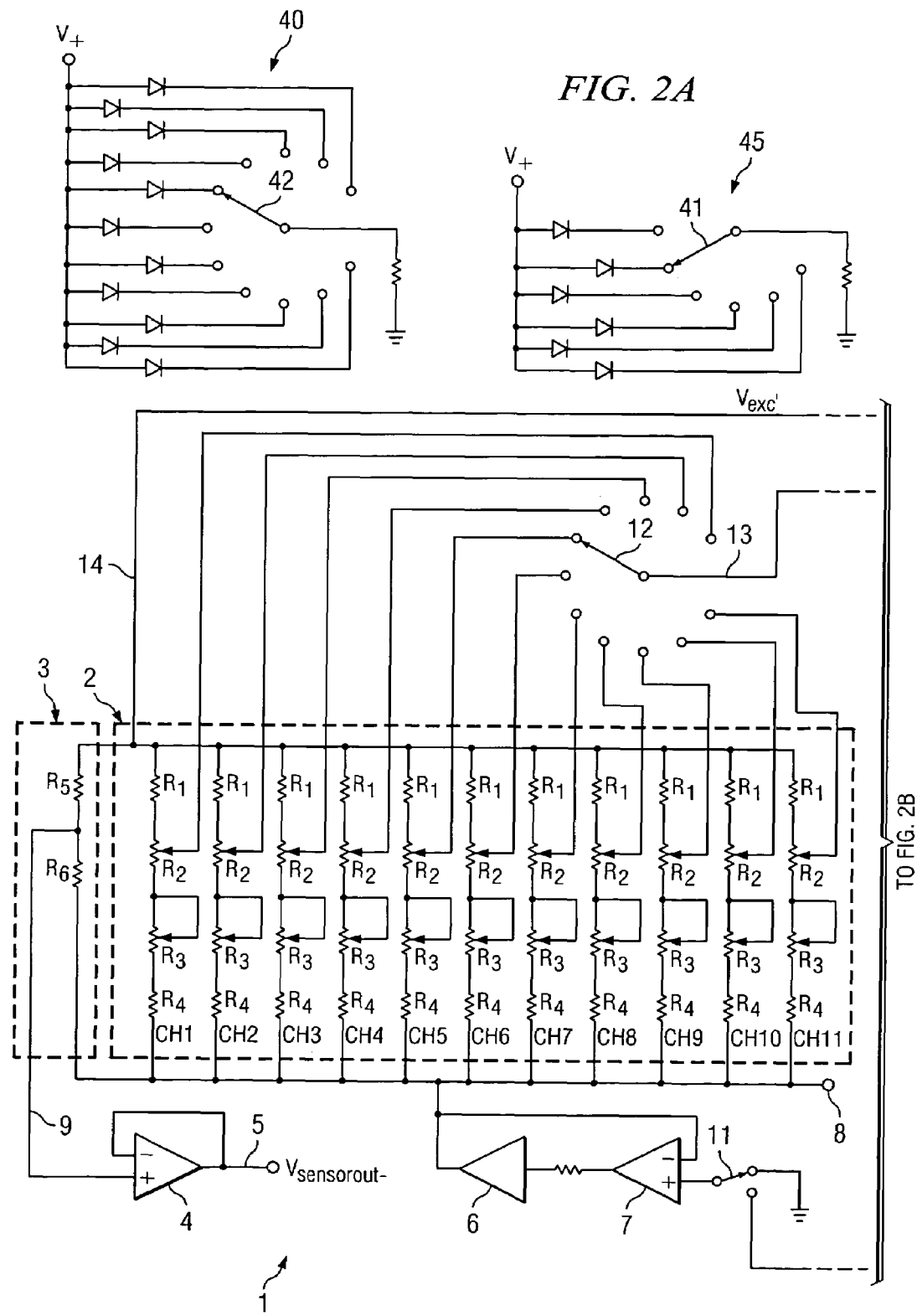
FIG. 2 is a schematic diagram of a bridge sensor emulator according to the present invention.
Figure 2B:
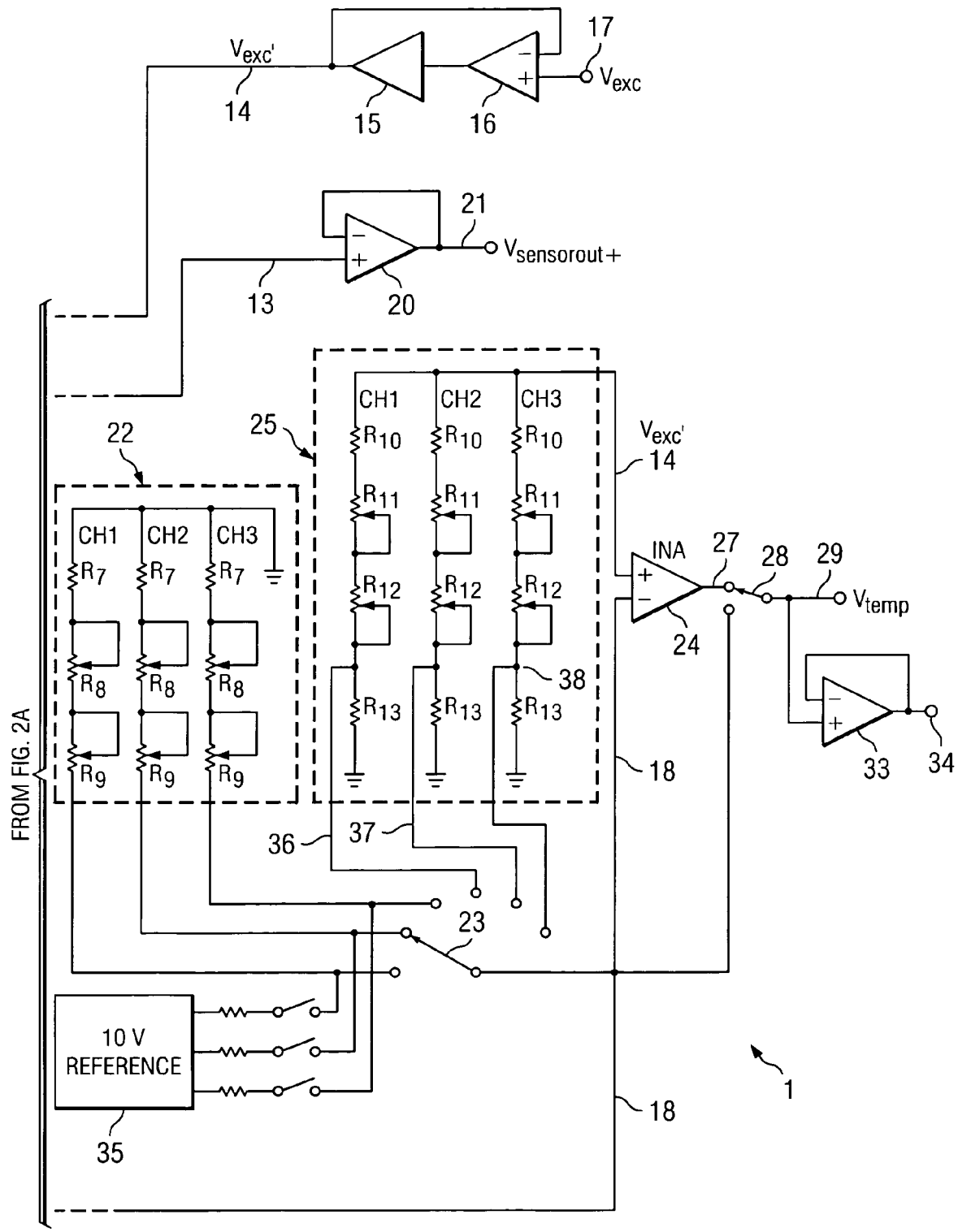

Referring to FIG. 2, bridge sensor emulator 1 includes a resistor array 2 which includes 11 channels CH1,2 . . . 11 for the purpose of emulating the Wheatstone bridge portion of a bridge sensor. Each channel includes four resistors R1, R2, R3, and R4 connected in series as shown between a buffered excitation signal conductor 14 and a reference signal conductor 8. Resistors R2 and R3 are manually adjustable potentiometers. Resistor R2 can be a 200 ohm, 20 turn potentiometer and resistor R3 can be a 10 ohm 20 turn potentiometer. Resistors R1 and R4 each can have a resistance of 10 kilohms for a 2.5 millivolt/volt range, or a resistance of 1 kilohm for a 25 millivolt/volt range. Bridge reference signal conductor 8 is connected to the output of a buffer circuit 6,7 including a high-current buffer amplifier 6 having its input coupled to the output of an operational amplifier 7 having its (−) input connected by conductor 8 to the output of amplifier 6. The (+) input of operational amplifier 7 is connected by a switch 11 to ground when a temperature signal representing a diode temperature is being emulated. The (+) input of operational amplifier 7 is connected to conductor 18 when a signal representing a resistor temperature is being emulated. Buffer amplifier 6 and operational amplifier 7 operate to provide a suitable reference ground voltage on conductor 8 for the 11 sensor emulator channels CH1-11 for the Wheatstone bridge portion of the bridge sensor being emulated.

The bridge reference ground voltage produced on conductor 8 by buffer 6,7 depends on the bridge sensor configuration. Specifically, when a temperature-sensing resistor Rt is in series with the Wheatstone bridge part of the bridge sensor, the voltage across the temperature-sensing resistor Rt reduces the voltage across the Wheatstone bridge part. The output of the "Rt emulator portion" 25 (i.e., resistor array 25) of bridge sensor emulator 1 can be applied through rotary switch 23, conductor 18, and rotary switch 11 to the input of operational amplifier 7 and raises the bridge reference ground level on conductor 8 to the voltage of the Rt temperature signal Vtemp. The modulated voltage on conductor 8 of the emulated "temperature-sensing resistor Rt" is the same the voltage which would appear on the actual temperature-sensing resistor Rt of the bridge sensor under the same excitation conditions.

The external excitation signal Vexc, which typically is modulated in such a manner as to account for nonlinearity and drift of the bridge sensor to be emulated, is applied by conductor 17 to the input of a buffer 15,16 including a buffer amplifier 15 having its input connected to the output of an operational amplifier 16 having its (−) input connected to conductor 14 and its (+) input connected to the external excitation voltage Vexc. A buffered excitation signal Vexe' is produced on conductor 14 by the output of buffer amplifier 15 and provides sufficient drive current to the relatively low impedance of resistor array 2. Resistor array 2 is programmable to emulate the Wheatstone bridge portion of the bridge sensor to be emulated. (Applying the appropriate buffered excitation voltage Exe' across the emulated bridge sensor allows the emulated bridge sensor output signal to be ratiometric, i.e., precisely proportional to Vexc'.) The wipers of the potentiometers R2 of each of the 11 channels CH1-11 of resistor array 2 are connected to 11 corresponding terminals of a rotary switch 12. The selection terminal 13 of rotary switch 12 is connected to the (+) input of a buffer amplifier 20, the output 21 of which produces a bridge sensor output voltage Vsensorout+. Resistors R5 and R6 adjacent to resistor array 2 are connected in series between buffered excitation voltage Vexc' conductor 14 and the "modulated" reference ground voltage on conductor 8, and generate a common mode voltage on conductor 9 that is approximately equal to one half of the buffered excitation voltage Vexc'. The voltage produced at junction 9 between voltage divider resistors R5 and R6 is applied to the (+) input of buffer amplifier 4, which produces an output voltage Vsensorout− on its output conductor 5. The difference voltage between Vsensorout+ and Vsensorout− represents the voltage output of the Wheatstone bridge part of the bridge sensor being emulated by bridge sensor emulator 1. (As an example, the differential voltage Vsensorout+ minus Vsensorout− might be somewhere between −12 millivolts and +12 millivolts for a 5 volt value of Vexc'.)

The control terminal of rotary switch 12 is ganged with the control terminal of a rotary switch 42 which connects one of 11 light emitting diodes 40 corresponding to the selected one of channels CH1-11 of resistor array 2 between a supply voltage V+ and ground, whereby that light emitting diode indicates which channel of resistor array 2 is presently selected to emulate the Wheatstone bridge portion of the bridge sensor. The light emitting diodes 40 corresponding to the 11 various channels are physically located immediately adjacent to the potentiometers of the corresponding channels so as to conveniently indicate which channel of the 11 channels CH1-11 of resistor array 2 is selected by means of rotary switch 12 and should be adjusted during initial setup of bridge emulator 1 so that it models the bridge sensor to be emulated.

Figure 1A:
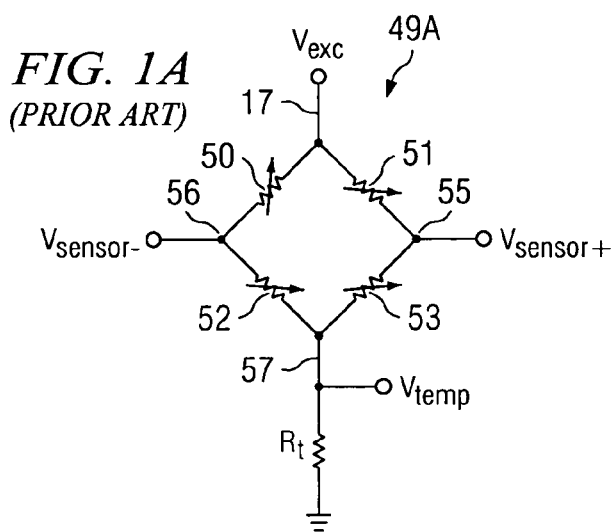
FIG. 1A is a schematic diagram of a typical series resistor bridge sensor.
Figure 1B:
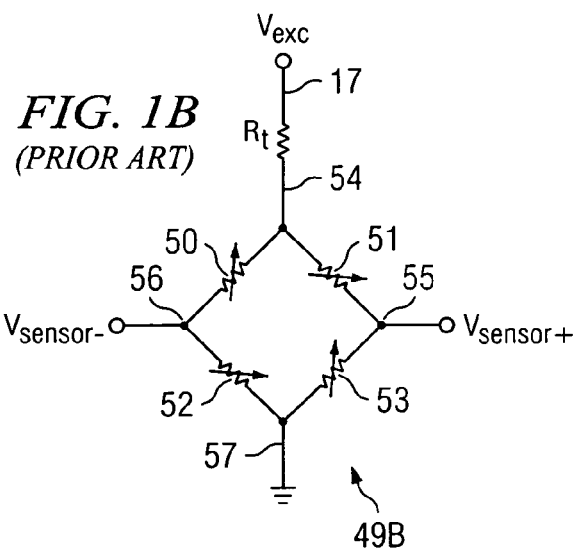
FIG. 1B is a schematic diagram of another typical series resistor bridge sensor.
Figure 1C:
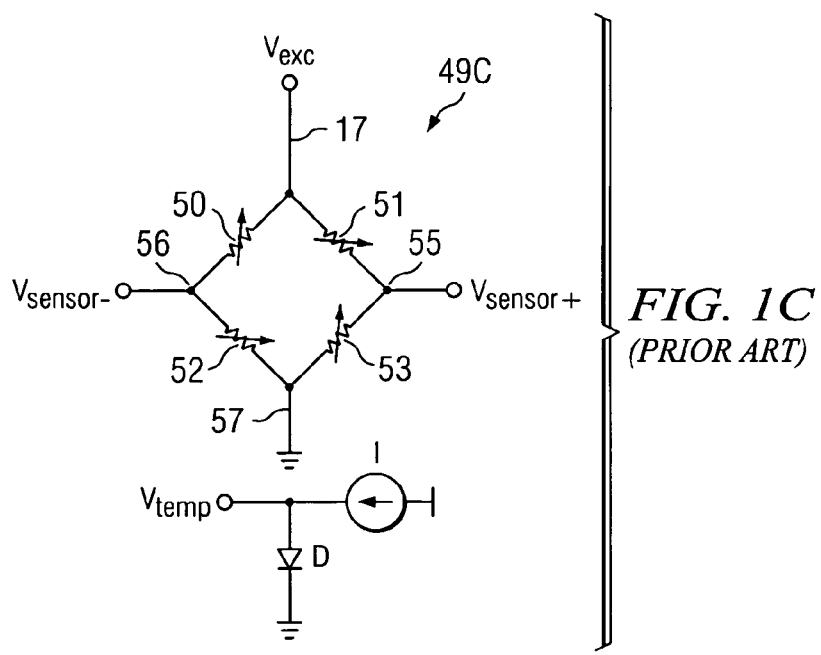
FIG. 1C is a schematic diagram of a typical diode bridge sensor.

Bridge sensor emulator 1 also includes a resistor array 22 which is programmable to emulate the temperature-sensing diode D shown in FIG. 1C. Resistor array 22 includes three channels CH1-3, each of which includes a resistor R7 and a pair of potentiometers R8, and R9 connected in series between a ground conductor and terminals 30, 31, and 32, respectively of a rotary switch 23. Bridge sensor emulator 1 also includes a resistor array 25 which is programmable to emulate a temperature-sensing resistor Rt shown in FIGS. 1A and B. Resistor array 25 includes three channels CH1-3, each of which includes a resistor R10 and potentiometers R11 and R12 coupled in series between excitation voltage conductor 14 and ground. The junctions between resistor R12 and resistor R13 of each of channels CH1-3 of resistor array 25 are connected to terminals 36, 37, and 38 of rotary switch 23. Resistor R7 has a resistance of 10 kilohms. Resistors R8 and R9 are potentiometers having resistances of approximately 100 kilohms and 5 kilohms, respectively. Resistors R10 and R13 have resistances of 10 kilohms and 2 kilohms, respectively. Resistors R11 and R12 are potentiometers having resistances of 50 kilohms and 2 kilohms, respectively. (Note that resisters R10, R11, and R12 actually represent the equivalent bridge circuit resistance including the combination of series-connected resistors 50 and 52 and series-connected resistors 51 and 53. Resistor R13 corresponds to temperature-sensing resistor Rt in the bridge sensor to be emulated.)

Rotary switch 23 is ganged with a rotary switch 41 which connects one of 6 light emitting diodes 45 between V+ and ground to indicate which of channels CH1-3 of resistor array 22 or channels CH1-3 of resistor array 25 are selected by rotary switch 23. The light emitting diodes for each channel are physically located immediately adjacent to the potentiometers of the corresponding channels so as to conveniently indicate which of channels CH11-3 of resistor array 22 or which of channels CH1-3 of resistor array 25 is selected by means of rotary switch 23 and should be adjusted during setup of bridge sensor emulator 1 so that it properly models the bridge sensor that the developer wants to emulate.

Buffered excitation voltage conductor 14 is connected to the (+) input of an instrumentation amplifier 24. The (−) input of instrumentation amplifier 24 is connected by conductor 18 to the control terminal of rotary switch 23 and to one terminal of a switch 28. The output of instrumentation amplifier 24 is connected by conductor 27 to another terminal of switch 28. The control terminal of switch 28 is connected by Vtemp conductor 29 to the (+) input of an operational amplifier 33 having its (−) input connected by conductor 34 to its output. Instrumentation amplifier 24 is used when Vtemp conductor 29 is connected to conductor 27 by means of switch 28, as subsequently described with reference FIG. 6, wherein temperature-sensing resistor Rt is located in the "top" portion of the bridge sensor as shown in FIG. 1B. In this case, the Rt temperature signal voltage Vtemp across temperature-sensing resistor Rt is referenced to Vexc' rather than to ground. The (+) input of instrumentation amplifier 24 is connected to buffered excitation voltage Vexc' and its (−) input is connected to the temperature signal from resistor array 22 or resistor array 25, which is normally referenced to ground. For the configuration shown in subsequently described FIG. 6, the output Vtemp on conductor 29 of the instrumentation amplifier 24 is equal to the buffered excitation voltage Vexc' minus the voltage across resistor R13 of the selected channel of resistor array 25.

However, when conductor 29 is connected by switch 28 to conductor 18, instrumentation amplifier 24 is inactive and the temperature signal across resistor R13 of the selected channel of resistor array 25 is referenced to ground. If a buffered version of the temperature output signal Vtemp on conductor 27 is desired, it can be taken from the output 34 of buffer 33.

Resistor array 22 is programmed and then a channel is selected using rotary switch 23 to emulate temperature-sensing diode D of FIG. 1C, and resistor array 25 is programmed and then a channel is selected using rotary switch 23 to emulate temperature-sensing resistor Rt of FIG. 1A or 1B. A person using bridge sensor emulator 1 first adjusts (for example, by using a small screwdriver) all of the channels of resistor arrays 2, 22, and/or 25 so that the output voltages of the channels match the corresponding characteristics of the bridge sensor to be emulated under the same excitation voltage conditions.

Ordinarily, the bridge sensor will be a commercially available device having a specification sheet setting forth its typical parameters. In some cases, a customer will have the option of using a software program available on the Internet to translate bridge sensor specifications to potentiometer settings for each channel of bridge sensor emulator 1.

Referring to FIG. 3, it is again noted that bridge sensor emulator 1 is used in an engineering bench setup 62 to facilitate rapid calibration of a bridge sensor signal conditioning chip. As previously mentioned, bridge sensor emulator 1 of the present invention is most useful as a tool to allow more convenient, rapid development of sensor signal conditioning systems which are used to couple a bridge sensor to a user system to automatically compensate non-linearity and drift of the bridge sensor. The fast emulation of the bridge sensors avoids the need for the developer to place the real bridge sensors in environmental chambers/ovens and couple them to the sensor signal conditioning systems being developed.

Figure 3:
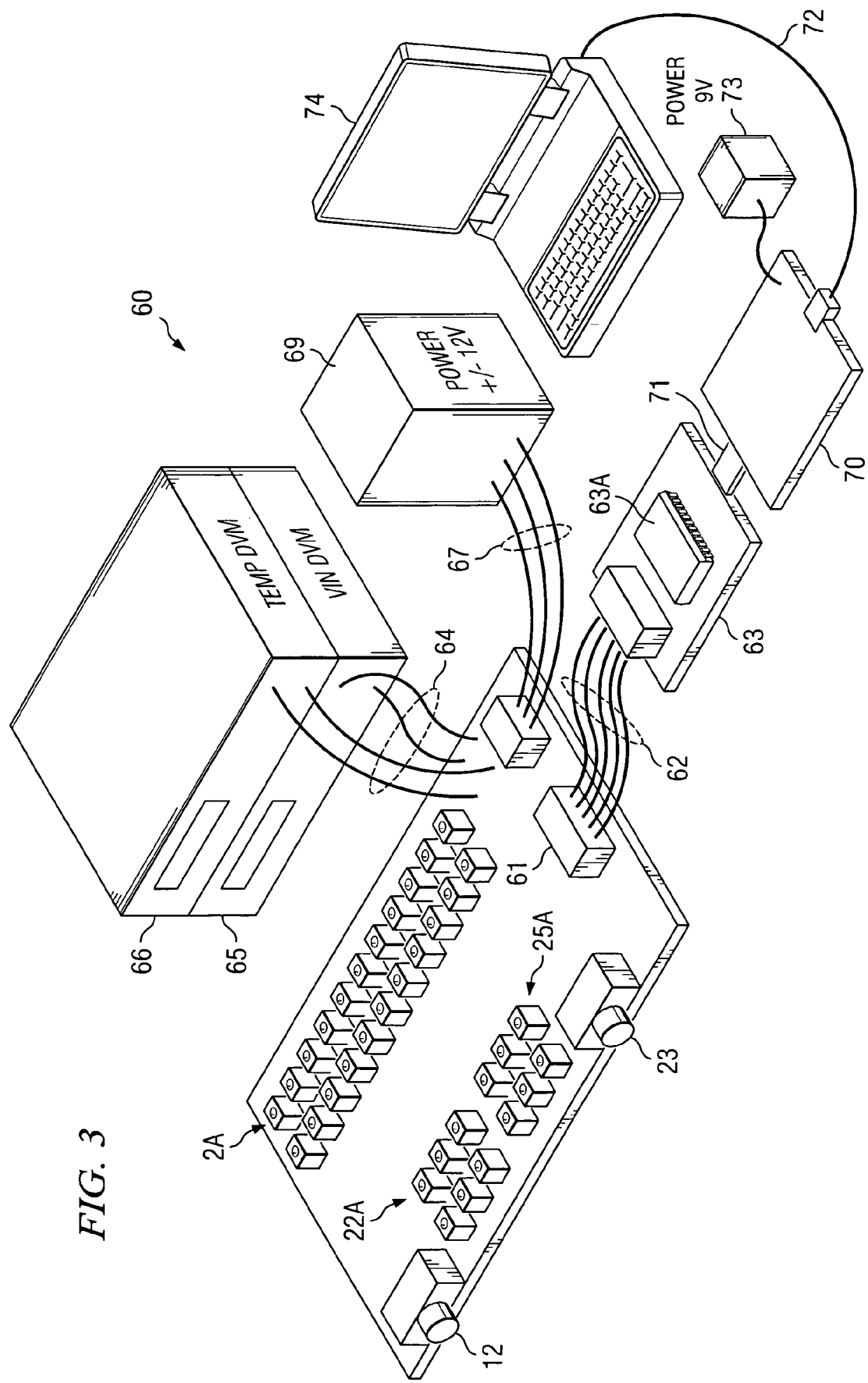
FIG. 3 is a generalized diagram of a typical engineering bench setup using the bridge sensor emulator of FIG. 2 to rapidly calibrate/characterize various bridge sensors.

In FIG. 3, rotary switches 12 and 23 are shown as being mounted on a printed circuit board. Reference numeral 2A designates the potentiometers R2 and R3 in each of the 11 channels CH1-11 of resistor array 2 in FIG. 2. Similarly, reference numeral 22A designates the potentiometers R8 and R9 of the three channels CH1-3 in resistor array 22, and reference numeral 25A designates the potentiometers R11 and R12 of the three channels CH1-3 in resistor array 25. Connector 61 provides connection of conductors 17, 29, and 34 to a signal conditioning system 63, which can be a Texas Instruments PGA309 Interface Board 63 including a Texas Instruments PGA309 signal conditioning chip 63A mounted on PGA309 Interface Board 63. Although signal conditioning chip 63A is the main component on interface board 63, several ancillary interface circuits also are mounted on interface board 63. Connector 68 provides connection of bridge sensor emulator board 1 to a power supply 69. Conductors 64 provide connection between the temperature output terminals 29 and ground and sensor output terminals 5 and 21 (FIG. 2) of bridge sensor emulator 1 and a digital voltmeter 66 which monitors the temperature of a Wheatstone bridge sensor being characterized, and a digital voltmeter 65 which monitors the bridge sensor output voltage thereof. Engineering bench setup 60 includes above mentioned signal conditioning chip 63A.

It should be appreciated that the programmable signal conditioning chip 63A, which can be used to condition signals produced by bridge sensor emulator 1 is a complex device. (Note that various other commercially available signal conditioning systems and associated software could be used instead of the PGA309 Interface Board 63.) PGA309 Interface Board 63 is connected by conductors 71 to a Texas Instruments PGA309 PC Interface 70. PC Interface 70 is powered by a power supply 73. Power supply 73 also provides operating power to PGA309 Interface Board 63 and the PGA309 sensor signal conditioning chip 63A through conductors 71. PGA309 Interface Board 63 and chip 63A are coupled through PC Interface 70 and an I2C serial bus 72 to a serial port of a personal computer 74 or other suitable computer. Computer 74 performs the functions of communicating with PGA309 sensor signal conditioning chip 63A, which is a complex "system on a chip" and includes various gain registers, offset registers, temperature compensation measurement circuitry, and various other circuits. All of those registers of PGA309 chip 63A are configured by computer 74 through the I2C serial bus and PGA309 PC Interface 70.

Bridge sensor emulator 1 emulates a four element Wheatstone bridge sensor. Since most bridge sensors have an associated temperature sensor, bridge sensor emulator 1 is designed to emulate the behavior of both series resistance bridge sensors and diode bridge sensors.

Figure 4:
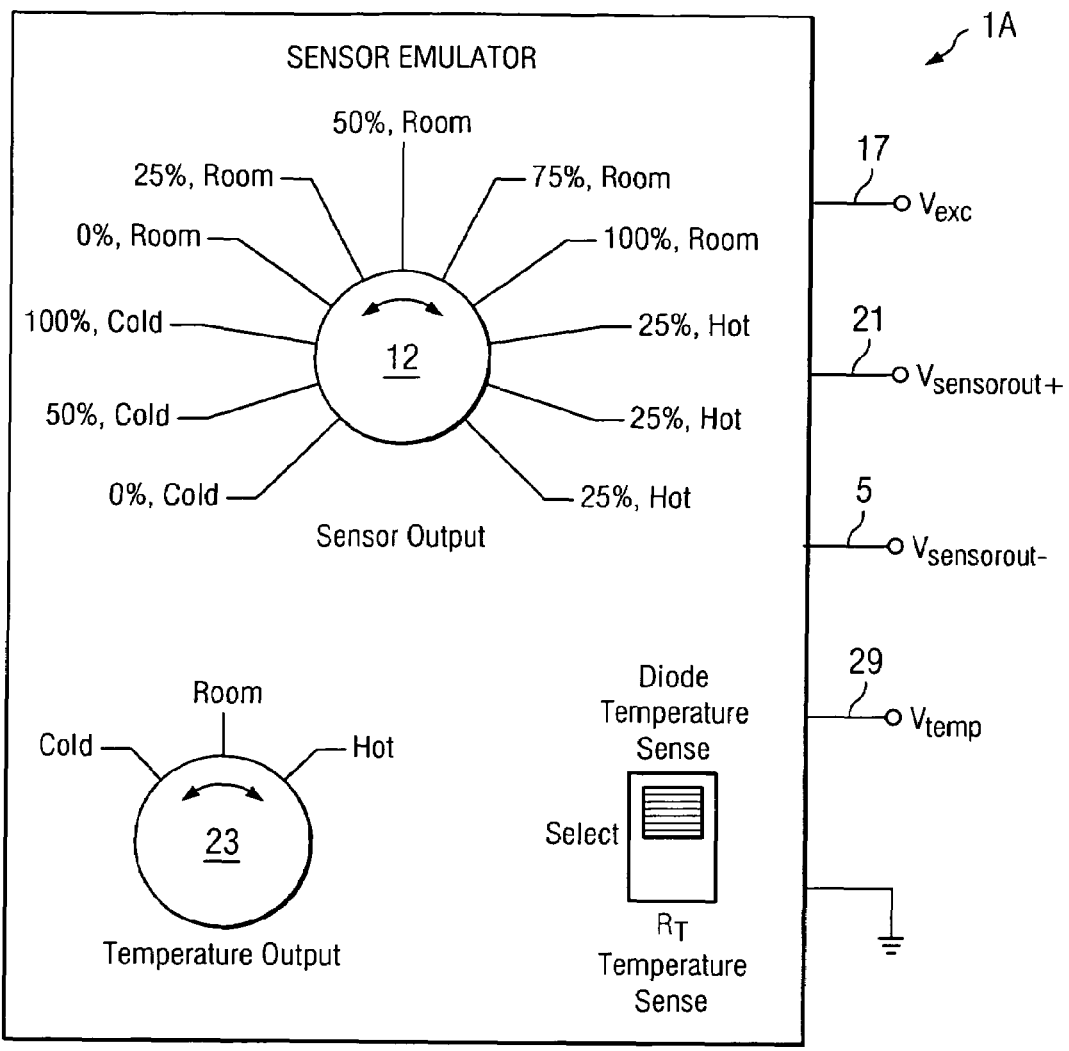
FIG. 4 is a diagram useful in explaining the overall operation of the bridge sensor emulator of FIG. 2.

Referring to FIG. 4, it may be helpful at this point to describe the "black box" operation of bridge sensor emulator 1. Bridge sensor emulator 1 emulates the behavior of the "series Rt" temperature-sensing resistor arrangements shown in FIGS. 1A and 1B by providing a programmable temperature signal and modulating the voltage across an emulated Wheatstone bridge part of bridge sensor emulator 1 in response to the amplitude of the temperature signal Vtemp. Bridge sensor emulator 1 also can be configured to emulate the bridge sensor shown in FIG. 1C, wherein diode D, rather than the temperature coefficient of the Wheatstone bridge portion, is used to measure the bridge sensor temperature Vtemp.

Figure 9:
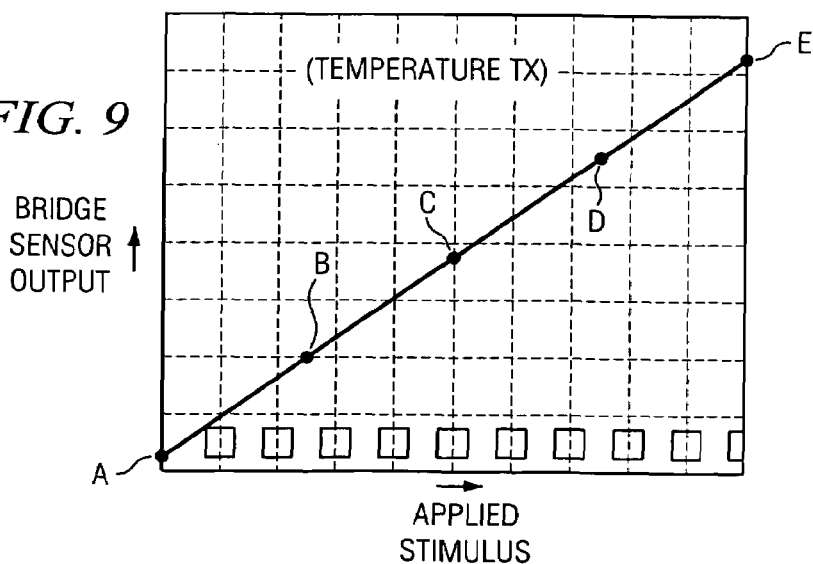
FIG. 9 is a graph of the output of a bridge sensor versus stimulus applied thereto.

Bridge sensor emulator 1 can model the response of a bridge sensor versus applied stimulus at 5 discrete points along a curve of bridge sensor output voltage versus applied stimulus at room temperature, for example at the points corresponding to A-E along the curve shown in FIG. 9. The applied stimulus level to be emulated is selected by adjusting the position of the knob of rotary switch 12. The temperature levels to be emulated are selected by adjusting the position of the knob of rotary switch 23. The output of the bridge sensor is proportionate to the excitation voltage and applied stimulus level as in the actual bridge sensor to be emulated. Bridge sensor emulator 1 can model the 5 discrete bridge sensor response points A, B, C, D, and E along the room temperature curve as shown in FIG. 9 and can model 3 discrete bridge sensor response points A, C, and E along the cold temperature and high temperature curves.

It is important to note that sensor signal conditioning systems such as the PGA309 Interface Board 63 often are programmed so as to modulate the external applied excitation voltage Vexc so as to compensate nonlinearity, drift, etc. of the bridge sensor. Bridge sensor emulator 1 models the behavior of a bridge sensor so that modulation of Vexc can be used to correct for bridge sensor nonlinearity. That is, the modulating of the excitation voltage Vexc applied to conductor 17 of bridge sensor emulator 1 directly affects the emulated bridge output in precisely the same way that the same modulation of Vexc affects the real bridge sensor being emulated.

Rotary switch 23 shown in FIG. 4 for the emulated temperature output Vtemp indicates three discrete temperatures, namely Cold, Room temperature, and Hot. Rotary switch 12 for the bridge sensor output Vsensorout+ minus Vsensorout− indicates that bridge sensor emulator 1 can be programmed to select the following bridge sensor outputs: 0% of maximum applied stimulus at cold temperature; 50% of maximum applied stimulus at cold temperature; 100% of maximum applied stimulus at cold temperature, 0% of maximum applied stimulus at room temperature; 25% of maximum applied stimulus at room temperature; 50% of maximum applied stimulus at room temperature; 75% of maximum applied stimulus at room temperature; 100% of maximum applied stimulus at room temperature; 0% of maximum applied stimulus at hot temperature; 50% of maximum applied stimulus at hot temperature; and 100% of maximum applied stimulus at hot temperature.

In the method for emulating the temperature of bridge sensor 49A as shown in FIG. 1A, it should be noted that the resistance of the emulated Wheatstone bridge part of bridge sensor emulator 1 has a strong temperature coefficient. The resistance of the emulated Wheatstone bridge section 2 of bridge sensor emulator 1 therefore generates a bridge current with a strong temperature coefficient flowing through temperature-sensing resistor Rt. That current generates a strongly temperature-dependent voltage Vtemp across temperature-sensing resistor Rt, which is accurately emulated by resistor R13 in block 25B of FIG. 5. Temperature drift of a bridge sensor is emulated at three discrete points using the simple voltage dividers of channels CH1-3 in resistor array 22 of FIG. 3. Temperature-sensing resistor Rt in FIG. 1A is typically located remotely from the Wheatstone bridge section of bridge sensor 49A and ordinarily does not have a strong temperature coefficient. Note that temperature-sensing resistor Rt can be connected to either the top or bottom part of bridge sensor 49A.

Before continuing the description of FIG. 5, it is again noted that the electrical properties of the particular bridge sensor to be emulated must be measured and utilized to program/adjust the various potentiometers in bridge sensor emulator 1 before it can emulate the bridge sensor. (The electrical properties of the bridge sensor can be easily measured if specification information for the bridge emulator is not available.) One way of determining the measured electrical property values of the bridge sensor to which the potentiometers of resistor array 22 or resistor array 25 should be adjusted in order to accurately emulate the bridge sensor is to use a program or spreadsheet supplied by a manufacturer or distributor of the particular bridge sensor to be emulated. For example, an Excel spreadsheet has been developed by the present assignee which allows a user to enter information from the manufacturer's data sheet for various bridge sensors and then computes the voltage settings for the 11 sensor output signals and the 3 temperature output signals for each channel of the emulator, so the appropriate potentiometers can be easily adjusted to obtain these channel voltage values. The spreadsheet can be found at the following web site: http://focus.ti.com/docs/toolsw/folders/print/sensoremulatorevm.html.

The various potentiometers shown in FIG. 2 are adjusted to program bridge sensor emulator 1 to enable it to emulate the operation of a particular resistive bridge sensor at discrete operating points for various levels of applied stimulus at selected temperatures over a selected temperature range. Once bridge sensor emulator 1 has been programmed, it allows the user to use rotary switches 12 and 23 to cycle the programmed bridge sensor emulator 1 through the set of 11 desired bridge sensor output conditions very quickly, as generally explained previously with reference to FIG. 4. In contrast, cycling the actual bridge sensor through the same set of desired output conditions ordinarily would be very time consuming. Furthermore, some bridge sensors have non-repeatability issues, for example, due to pressure hysteresis and/or temperature hysteresis. That may result in difficulties/inaccuracies in calibrating a sensor signal conditioning chip using a bridge sensor and conventional temperature cycling techniques. Such difficulties are completely avoided by using bridge sensor emulator 11 to emulate the bridge sensor.

Use of bridge sensor emulator 1 allows the user to program the sensor signal conditioning chip in many different ways to enable the user to quickly and easily determine the optimal calibration settings for a given application.

Figure 5:
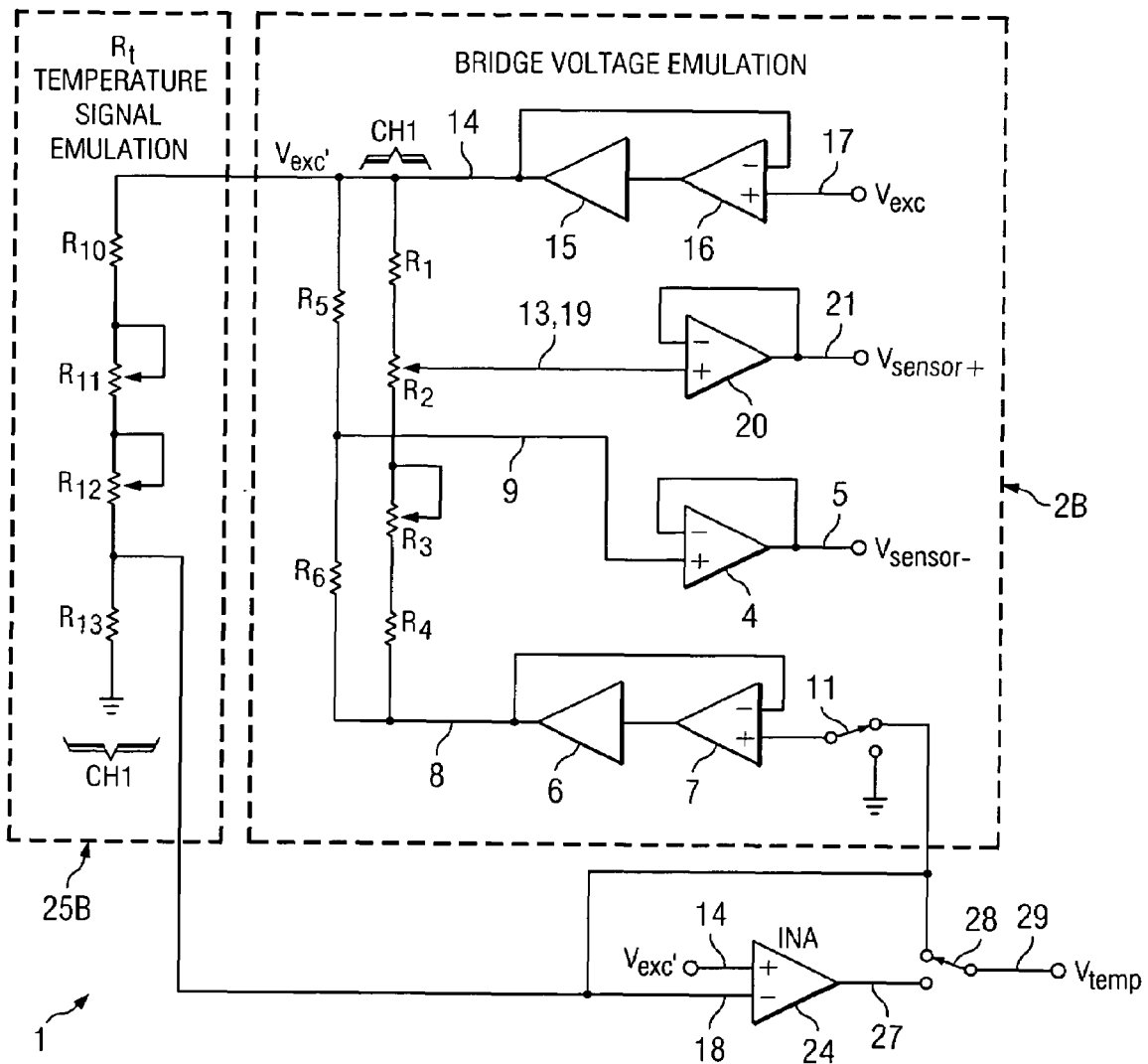
FIG. 5 is a schematic diagram illustrating the bridge sensor emulator of FIG. 2 when it is programmed to emulate a series resistor bridge sensor with the sense resistor connected between ground and a Wheatstone bridge section of the bridge sensor.

FIG. 5 illustrates the case wherein temperature-sensing resistor Rt is connected to the bottom section of the bridge sensor 49A. Referring to FIG. 5, resister array 25 of bridge sensor emulator 1 is programmed to provide emulation of bridge sensor 49A of FIG. 1A. Specifically, bridge sensor emulator 1 is programmed to provide accurate emulation of the Rt temperature signal Vtemp of bridge sensor 49A by setting appropriate values of potentiometers R11 and R12 of channel CH1 in resistor array 25. Resistor array 2 is programmed to provide emulation of Wheatstone bridge voltage section of the bridge sensor 49A by setting appropriate values of potentiometers R11 and R12 of channel CH1 of resistor array 2 and by connecting switches 11 and 28 to conductor 18, as shown in block 2B. Channels CH2-11 are programmed similarly.

Bridge sensor emulator 1 has three channels CH1-3 in resistor array 25 which can be programmed to emulate the Rt temperature signal Vtemp under different conditions. The three channels are selectable by means of rotary switch 23. FIG. 5 illustrates only channel CH1 in resistor array 2 of bridge sensor emulator 1. However, when fully programmed, bridge sensor emulator 1 uses all 11 of the channels and rotary switch 12 (FIG. 2) to generate the 11 previously mentioned output states shown in FIG. 4 to thoroughly emulate any particular bridge sensor. The 11 output states are shown in Table 1.

TABLE 1

| Channel | % of Maximum Applied Stimulus | Temperature |
| --- | --- | --- |
| 1 | 0% | Cold |
| 2 | 50% | Cold |
| 3 | 100% | Cold |
| 4 | 0% | Room |
| 5 | 25% | Room |
| 6 | 50% | Room |
| 7 | 75% | Room |
| 8 | 100% | Room |
| 9 | 0% | Hot |
| 10 | 50% | Hot |
| 11 | 100% | Hot |

The 11 output states are used to emulate the bridge sensor output at 3 different temperatures, for 5 levels of applied stimulus at room temperature and 3 levels of applied stimulus at cold temperatures and hot temperatures, as indicated in the previous discussion of FIG. 4. This configuration is used because the most common bridge sensor calibration algorithms require three different temperatures and three different levels of applied stimulus. The reason that 5 levels of applied stimulus are emulated at room temperature but only 3 levels are emulated at cold and hot temperatures is that the five levels of applied stimulus at room temperature permit evaluation of the bridge sensor linearity at 25% and 75% of maximum applied stimulus at room temperature, which is sufficient because the bridge sensor linearity correction is determined at the hot and cold temperatures by the emulation for 50% of maximum applied stimulus. Therefore, emulating only three levels of applied stimulus at the hot and cold temperatures allows reduction of the cost and complexity of bridge sensor emulator 1 without sacrificing its usefulness. The voltage range of differential bridge sensor output signal Vsensorout+ minus Vsensorout− for each of the 11 channels CH1-11 is generated by adjusting potentiometers R11 and R12 of each channel, respectively, with potentiometer R12 being used for fine adjustments. Using the components shown in FIG. 5, the circuit output range is +−25 millivolts for a 5 volt excitation voltage. (Note that the output range of programmed bridge sensor emulator 1 as shown in FIG. 5 can be changed by re-scaling resistors R10 and R13. For example, using a value of 1 kohm instead of 10 kilohms for resistors R10 and R13 will change the output range to +−250 millivolts with a 5 volt excitation voltage.)

Thus, bridge sensor emulator 1 can be used to emulate a wide range of bridge sensor outputs to a high degree of accuracy and repeatability.

Bridge sensor emulator 1 also emulates the temperature output signal Vtemp of bridge sensor 49A for either a bridge sensor which uses a diode D or a bridge sensor which uses a resistor Rt to generate the temperature signal Vtemp. FIG. 5 illustrates how emulation of the Rt temperature signal Vtemp on conductor 29 is generated. Potentiometers R11 and R12 are used to emulate the temperature coefficient of the resistance of the Wheatstone bridge section, and R13 is used to emulate the temperature sensor resistance Rt. Three replicas of this resistive voltage divider are used as the three channels CH1-3, respectively, of resistor array 25 (FIG. 2) to generate values of Vtemp at cold, room, and hot temperatures, respectively.

An important aspect of the "Rt method" of temperature sensing is the previously mentioned reduction of the amount of the excitation voltage across the Wheatstone bridge portion of the bridge sensor by the amount of the Vtemp voltage drop across the series resistance Rt. For example, if Vtemp=1 volt and Vexc=5 volt, then only 4 volts remains for the excitation of the Wheatstone bridge portion. It should be noted that bridge sensor emulator 1 accurately models this phenomena. An important benefit of the bridge voltage emulation circuit programmed as shown in FIG. 5 is that the Rt temperature signal Vtemp can be modulated by the excitation voltage Vexc in the same way as in the actual bridge sensor 49A being emulated. Also, the temperature output signal Vtemp, which is buffered by buffer circuit 6,7, is used to modulate the differential bridge sensor output signal Vsensorout+ minus Vsensorout−. Therefore, the bridge sensor output signal Vsensorout+ minus Vsensorout− is the same as that of the series Rt bridge sensor 49A being emulated. The output voltage of the emulated temperature-sensing resistor Rt is fed back to the bottom of the Wheatstone bridge emulating resistor array 2B via the buffer circuit 6,7, to emulate the change in the amount of buffered excitation voltage Vexe' across the resistor array 2 due to the voltage across the temperature-sensing Rt in series with the Wheatstone bridge section of the actual bridge sensor being emulated.

Figure 6:
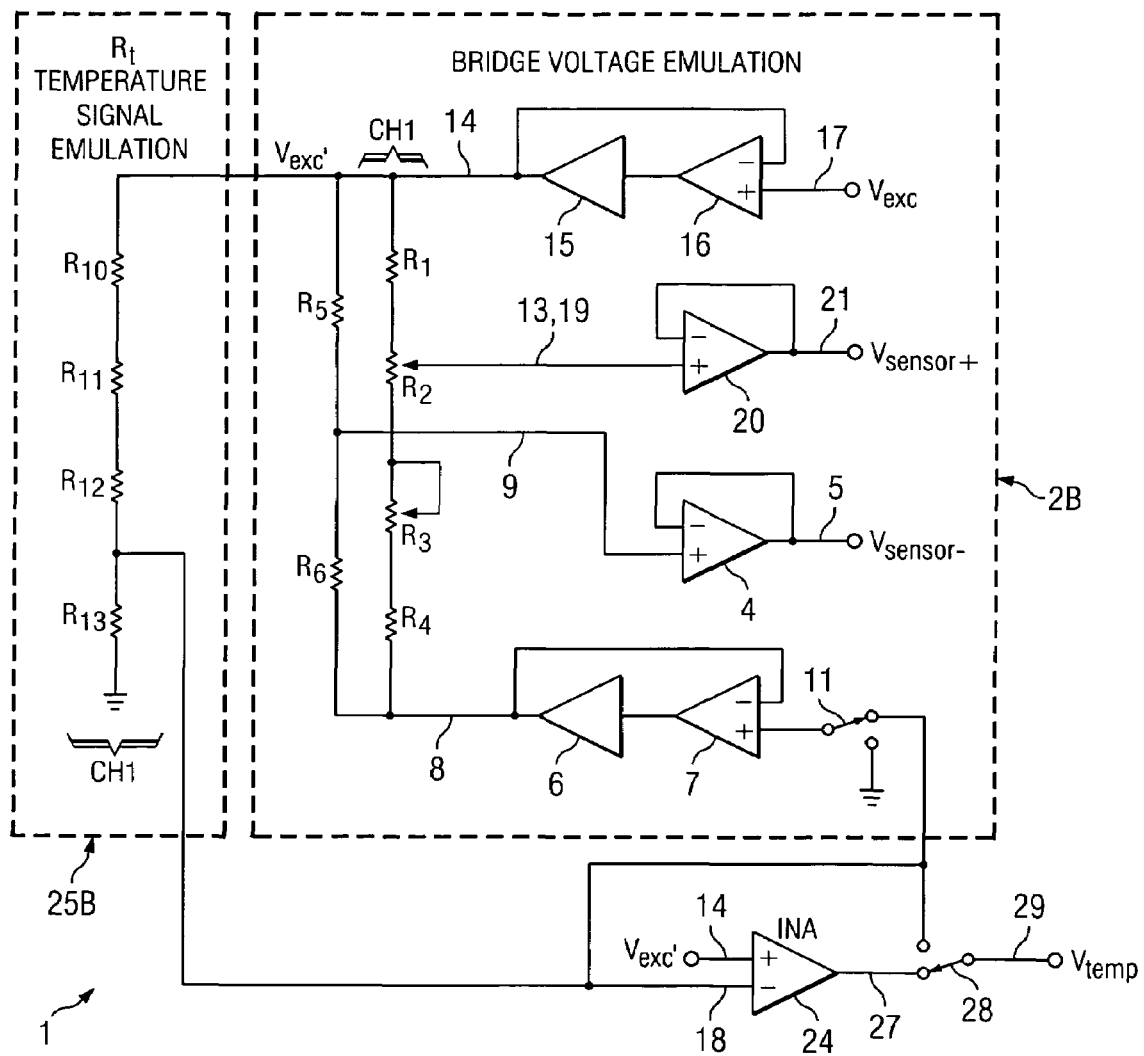
FIG. 6 is a schematic diagram illustrating a configuration of the bridge sensor emulator of FIG. 2 when it is programmed to emulate a series resistor bridge sensor with the sense resistor connected between an excitation voltage and a Wheatstone bridge section of the bridge sensor.

FIG. 6 illustrates how bridge sensor emulator 1 generates the bridge output signal and the temperature signal when the temperature-sensing resistor Rt is connected to the top of the bridge sensor 49B, as shown in FIG. 1B. In FIG. 6, emulation of the Rt temperature signal Vtemp for bridge sensor 49B on conductor 29 is somewhat different than for bridge sensor 49A as shown in FIG. 5. In FIG. 6, instrumentation amplifier 24 is connected to conductor 29 by means of switch 28 in order to reference Vtemp to Vexc', rather than to ground as in FIG. 5.

Figure 7:
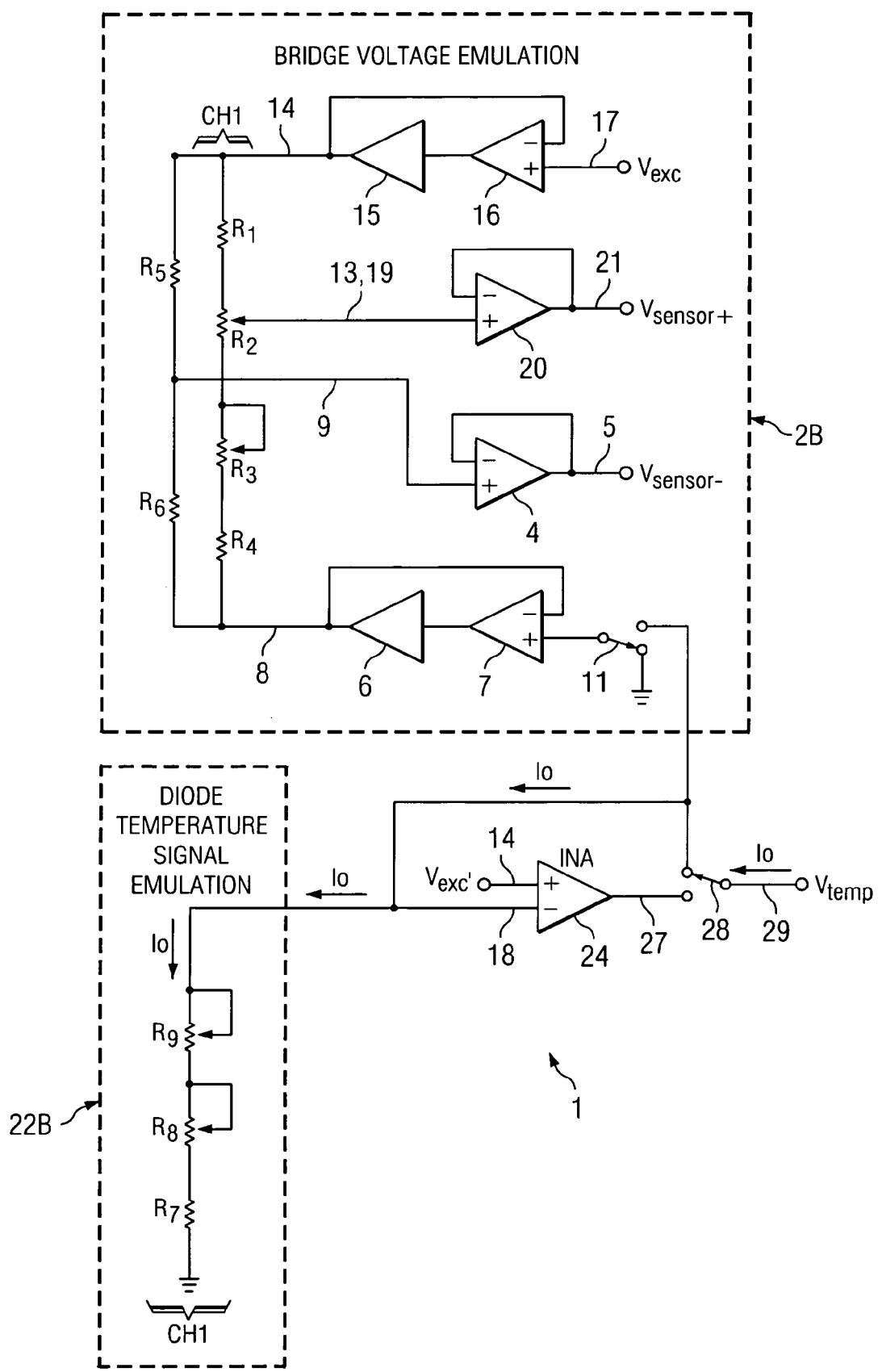
FIG. 7 is a schematic diagram illustrating the bridge sensor emulator of FIG. 2 when programmed to emulate a series diode bridge sensor connected to an external current source.

The previously mentioned bridge sensor 49C of FIG. 1C with diode temperature sensing can be emulated by bridge sensor emulator 1 by using a resistive voltage divider to emulate diode D, as shown in block 22B in FIG. 7. Diode D is in close thermal contact with the Wheatstone bridge portion of bridge sensor 49C, and a constant current I is driven through diode D. Resistor R7 and potentiometers R8 and R9 in channel CH1 of resistor array 22 are used to develop a voltage on conductor 18 which emulates the diode voltage Vtemp on conductor 18. This structure is repeated to also form channels CH2 and CH3. Channels CH1-3 in resistor array 22B of FIG. 7 are used in conjunction with rotary switch 23 to generate Vtemp signals representing the cold temperature, room temperature, and hot temperature conditions, respectively. Conductor 18 is connected by means of switch 28 to Vtemp output conductor 29. This voltage divider in bridge sensor emulator 1 includes resistor R7 and potentiometers R8 and R9 in channel CH1 of resistor array 22. In this case switch 11 is connected to ground, so that the bottom conductor 8 of Wheatstone bridge emulating resistor array 2B is at ground potential. This configuration requires the bias current I to be supplied from an external current source, which can be a signal conditioning chip.

Figure 8:
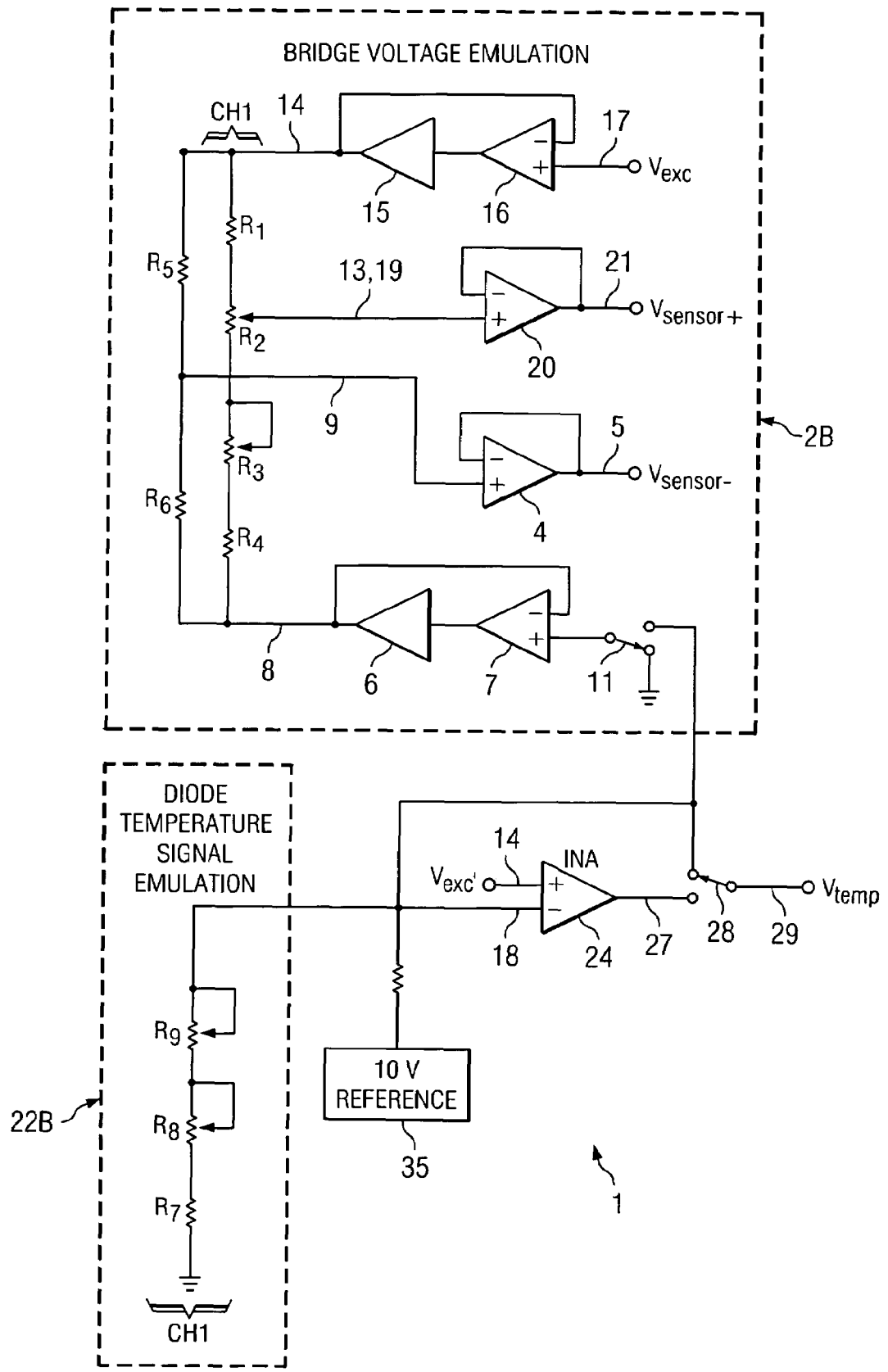
FIG. 8 is a schematic diagram illustrating the bridge sensor emulator of FIG. 2 when programmed to emulate a series diode bridge sensor connected to an on-board voltage reference of the bridge sensor emulator.

FIG. 8 shows the same structure of the program to bridge sensor emulator 1 as FIG. 6, except that the current I is not supplied through switch 28 and conductor 18 from an external current source. Instead, the current I is produced by connecting a programmable reference voltage source 35 that is included in bridge sensor emulator 1 so as to apply reference voltage across the series connection of resistor R7 and potentiometers R8 and R9, thereby causing the current I to flow-through resistor R7 and potentiometers R8 and R9.

The bridge sensor emulator 1 described herein allows the temperature signal Vtemp of the actual bridge sensor to be accurately emulated, and also allows the differential bridge sensor output voltage (Vsensorout+ minus Vsensorout−) to be accurately emulated in such a way as to permit thorough, accurate and fast calibration/characterization of the bridge sensor being emulated in a few minutes, rather than requiring days. Therefore, an engineer can perform many bridge sensor signal conditioning chip calibration runs over the course of a single day, and can focus attention on debugging bridge sensor hardware or developing their calibration algorithm instead of waiting for hours to accomplish each thermal cycle required for conventional calibration/characterization of bridge sensors.

Perhaps it should be noted that although a precision voltage source theoretically could be used to emulate a bridge sensor, there would be various shortcomings to this approach. A precision voltage source could not be modulated in accordance with changing bridge sensor excitation.

This would be problematic because many available bridge sensor signal conditioning chips modulate the bridge sensor excitation to compensate for bridge sensor nonlinearity. Also, it is much more convenient to have all the different bridge sensor conditions pre-programmed so that a sequence of different conditions can be applied to the bridge sensor without having to reprogram a precision voltage source for each different condition. Furthermore, three precision voltage sources would be required to properly emulate a bridge sensor, one for the bridge sensor common mode voltage (Vsensorout−), one for the bridge sensor output voltage (Vsensorout+), and one for the bridge sensor temperature signal (Vtemp). This approach would be substantially more expensive than bridge sensor emulator 1. Furthermore, the precision voltage sources would need to be reprogrammed for each desired condition to which the bridge sensor should be subjected in order to achieve accurate calibration/characterization. This would be highly inconvenient.

Figure 10:
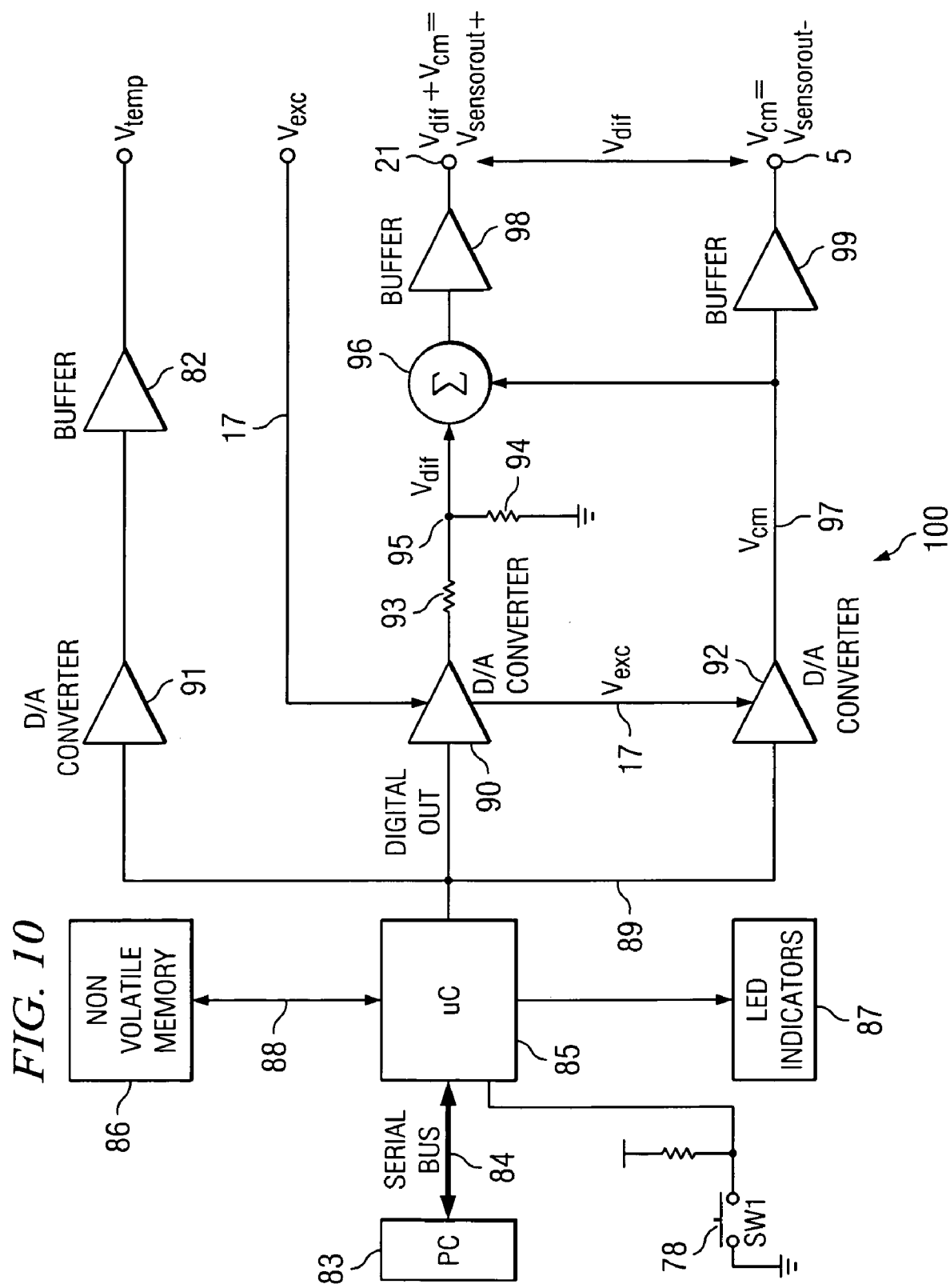
FIG. 10 is a block diagram of another embodiment of the invention.

FIG. 10 shows an alternate embodiment of the invention, wherein bridge sensor emulator 100 includes a microcontroller coupled to three digital to analog converters to produce the emulated signals Vsensorout+, Vsensorout−, and Vtemp. Microcontroller 85 is connected by a serial bus 84 to a personal computer 83, by a bus 88 to a non-volatile memory 86, and by a digital bus 89 two digital to analog converters 90, 91, and 92. Microcontroller 85 also is coupled to control various light emitting diodes 87 and to a pushbutton switch 78. Digital to analog converters 90 and 92 have reference voltage terminals connected by conductor 17 to receive the excitation signal Vexc. A voltage divider including resistors 93 and 94 is coupled between ground and the output of digital to analog converter 90. The junction between resistors 93 and 84 produces a voltage Vdif which is coupled by conductor 95 to one input of an analog summer 96. Analog to digital converter 92 produces a common mode output voltage Vcm which is coupled by conductor 97 to another input of analog summer 96 and also to an input of a buffer circuit 99. The output of analog summer 96 is coupled to the input of another buffer circuit 98. The output of buffer circuit 98 produces a voltage on conductor 21 equal to the sum of Vdif and Vcm which is equal to the emulated bridge sensor output voltage Vsensorout+. The output of buffer 99 produces a signal on conductor 5 equal to Vcm which is equal to the emulated sensor output voltage Vsensorout−. The output of digital to analog converter 91 is connected to the input of a buffer circuit 82, the output of which produces the temperature signal Vtemp on conductor 29.

Personal computer 83 is used to program the characterization information of the bridge sensor to be emulated into nonvolatile memory 86. After this has been accomplished, personal computer 83 can be removed from bridge sensor emulator 100. Switch 78 is used to sequentially cycle through the 11 previously described bridge sensor conditions which are to be emulated by emulator 100. The present bridge sensor condition being emulated is displayed by means of the light emitting diode indicators of block 87. The voltage divider 93,94 is utilized to divide down the analog output of digital analog converter 90 in order to produce the millivolt-level signals that typically are output by bridge sensors. Digital to analog converter 92 provides the necessary common mode signal on which the low-level bridge sensor output voltage is superimposed. Summing circuit 96 combines the divided-down bridge sensor output voltage produced on conductor 95, which is referenced to ground, with the common mode voltage on conductor 97. The differential common bridge sensor output voltage then is the difference between the voltages on conductor 21 and conductor 5. It should be noted that the three digital analog converters should be MDACs (multiplying digital to analog converters) that use the excitation voltage Vexc for a reference, so that the emulated sensor output voltage between conductors 21 and 5 is ratiometric with respect to Vexc.

Personal computer 83 contains software that enables it to communicate with microcontroller 85 so as to write bridge sensor characterization data (for example, data for the 11 conditions as previously described with reference to FIG. 4) into nonvolatile memory 86. Then pushbutton 78 can be repeatedly actuated to cause bridge sensor emulator 100 to sequentially produce emulated bridge sensor outputs corresponding to the 11 conditions. Relatively simple software that can be easily implemented by one skilled in the art is executed by microcontroller 85 to increment to the next of the 11 conditions, causing 3 digital output words representing the bridge sensor output to be emulated to be applied to the inputs of digital to analog converters 90, 91, and 82, respectively, causing them to generate corresponding analog values that represent Vsensorout+, Vsensorout−, and Vtemp, respectively. Microcontroller 85 also updates the display produced by LED indicators 87 to indicate the one of the 11 conditions to which the present emulated outputs correspond.

Thus, bridge sensor in a layer 100 operates to emulate a bridge sensor which includes a bridge circuit and a temperature-sensing device (temperature-sensing resistor Rt or temperature-sensing diode D) by providing 11 stored voltage variables for representing the 11 bridge sensor conditions previously described with reference to FIG. 4. Each of the 11 stored voltage variables is programmed by means of personal computer 83 operating in conjunction with microcontroller 85 and stored in nonvolatile memory 86 so as to represent the various bridge sensor output voltages for the corresponding 11 bridge sensor conditions to be emulated, by setting each of the 11 stored voltage variable to corresponding voltages representing the three bridge sensor outputs Vsensorout+, Vsensorout−, and Vtemp . This can be done for the three types of bridge sensors 49A-C shown in FIGS. 1A-C.

Once the 11 sets of bridge sensor characterization information are stored in nonvolatile memory 86, pushbutton switch 78 can be repetitively actuated to cycle through the 11 states, causing the 11 sets of stored values of Vsensorout+, Vsensorout−, and Vtemp be sequentially emulated. The emulated bridge sensor outputs can be coupled to the corresponding inputs of a bridge sensor signal conditioning system to aid in the rapid development, design, and/or programming thereof.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

For example, although the temperature-sensing device is disclosed as being a temperature-sensing resistor or a diode, it could be a thermistor or a thermocouple. Although rotary switches are disclosed in the described embodiment, various other types of switching circuits could be utilized to accomplish the same functions.

What is claimed is:

1. A system for emulating a bridge sensor including a bridge circuit and a temperature-sensing device, an element of the bridge sensor being a transducer for receiving an applied stimulus, the system comprising:
   (a) a first emulation circuit programmable to emulate an output signal of the bridge circuit under a first number of conditions, each condition including a different combination of a selected an applied stimulus level and a selected temperature of the bridge circuit;
   (b) a second emulation circuit programmable to emulate the temperature-sensing device for a second number of temperatures;
   (c) an excitation signal circuit for applying an excitation signal to the first emulation circuit;
   (d) a first output circuit coupled to the first emulation circuit for producing a first emulated bridge output signal representative of a selected one of the first number of conditions;
   (e) a common mode sensor output voltage circuit coupled to the first emulation circuit for generating an emulated common mode sensor output voltage; and
   (f) a second output circuit coupled to the second emulation circuit for producing a first emulated temperature output signal representative of a selected one of the second number of temperatures.

2. The system of claim 1 wherein the first number is 11 and the second number is 3.

3. The system of claim 1 wherein the first emulation circuit includes a first number of resistive channels corresponding to the first number of conditions, respectively, wherein each channel of the first number of resistive channels includes a first resistive divider circuit which is programmable to emulate a bridge sensor voltage corresponding to a different one of the first number of conditions.

4. The system of claim 3 wherein the first output circuit includes a first selector circuit having a selector terminal coupled to an input of an output buffer for selectively coupling the input of the output buffer to one of a plurality of adjustable voltage terminals in the first emulation circuit representative of the first number of different conditions, respectively.

5. The system of claim 4 wherein the second emulation circuit includes a second number of resistive channels to emulate the temperature-sensing device for the second number of temperatures, wherein each channel of the second number of resistive channels includes a second resistive divider circuit which is programmable to emulate a temperature-sensing device voltage corresponding to a different one of the second number of temperatures.

6. The system of claim 4 wherein the temperature-sensing device of the bridge sensor to be emulated includes a temperature-sensing resistor coupled between a first conductor of the bridge circuit and a reference ground conductor.

7. The system of claim 4 wherein the temperature-sensing device of the bridge sensor to be emulated includes a temperature-sensing resistor coupled between a first conductor of the bridge circuit and the excitation signal.

8. The system of claim 4 wherein the temperature-sensing device of the bridge sensor to be emulated includes a temperature-sensing diode in close thermal coupling with the bridge circuit, a bias current flowing through the temperature-sensing diode.

9. The system of claim 4 wherein the temperature-sensing device of the bridge sensor to be emulated may include either a temperature-sensing resistor coupled to the patent bridge circuit or a temperature-sensing diode in close thermal coupling with the bridge circuit, wherein the second emulation circuit is programmable to emulate the temperature-sensing resistor for the second number of temperatures, the system also including a third Emulation circuit programmable to emulate the temperature-sensing diode for the second number of temperatures.

10. The system of claim 5 wherein each of the first number of resistive channels includes a first resistor, a first potentiometer, a second potentiometer, and a second resistor coupled in series between the excitation signal circuit and a reference ground conductor, and a wiper of the first potentiometer is coupled to conduct a signal representative of a corresponding one of the first number of conditions associated with that resistive channel to an input of the output circuit.

11. The system of claim 10 wherein the common mode sensor output voltage circuit for emulating the emulated common mode sensor output voltage of the bridge sensor includes a third resistor and a fourth resister coupled in series between the excitation signal circuit and the reference ground conductor.

12. The system of claim 10 wherein the temperature-sensing device of the bridge sensor to be emulated may include either a temperature-sensing resistor coupled to the bridge circuit or a temperature-sensing diode in close thermal coupling with the bridge circuit, and wherein the second emulation circuit is programmable to emulate the temperature-sensing resistor for the second number of temperatures, the system also including a third emulation circuit programmable to emulate the temperature-sensing diode for the second number of temperatures,
   wherein the second emulation circuit is programmable to emulate the temperature-sensing resistor for the second number of temperatures and includes a number of resistive channels equal to the second number, wherein each channel of the second emulation circuit includes third and fourth resistors and third and fourth potentiometers coupled in series between the excitation signal circuit and the reference ground conductor, and wherein a terminal of the fourth resister is coupled to the second output circuit, the first emulated temperature output controlling a reference ground voltage on the reference ground conductor, and
   wherein the third emulation circuit is programmable to emulate the temperature-sensing diode for the second number of temperatures and includes a number of resistive channels equal to the second number, wherein each channel of the third emulation circuit includes a fifth resistor and fifth and sixth potentiometers coupled in series between a ground conductor and the second output circuit.

13. The system of claim 12 wherein the second output circuit includes a second selector circuit having a first terminal for selectively coupling the first terminal to one of a plurality of adjustable voltage terminals in the second or third emulation circuits representative of the second number of temperatures, respectively.

14. The system of claim 13 wherein the first selector circuit includes a first rotary switch having a first terminal coupled to an input of the output buffer and a number of selectable terminals equal to the first number coupled to the plurality of adjustable voltage terminals of the first emulation circuit, respectively, and wherein the second selector circuit includes a second rotary switch having a selector terminal coupled to the first terminal of the second selector circuit and a number of selectable terminals coupled to the plurality of adjustable voltage terminals in the second and third emulation circuits, respectively, representative of the second number of temperatures.

15. The system of claim 1 wherein the bridge sensor emulating system is coupled to a sensor signal conditioning chip to allow the bridge sensor emulating system under development to function as a signal source during the development, whereby the bridge sensor emulator can rapidly emulate various conditions to aid in the development.

16. A method for emulating a bridge sensor including a bridge circuit and a temperature-sensing device, an element of the bridge sensor being a transducer for receiving an applied stimulus, the method comprising:
  (a) providing a first number of resistive channels each corresponding to a different selected condition, wherein each of the first number of resistive channels includes a corresponding first programmable resistive divider circuit, each condition including a different combination of a selected applied stimulus level and a selected temperature of the bridge circuit;
  (b) programming each of the first number of resistive channels to emulate a bridge sensor voltage corresponding to a different one of the first number of conditions by producing a voltage representative of a first sensor output voltage at a predetermined point of the first programmable resistive divider circuit of that resistive channel, respectively;
  (c) providing a second number of resistive channels each corresponding to the second number of different selected temperatures of the bridge circuit, wherein each of the second number of resistive channels includes a second programmable second resistive divider circuit;
  (d) programming each of the second number of resistive channels to emulate a different bridge circuit temperature voltage across the temperature-sensing device of the bridge sensor to be emulated voltage by producing a voltage representative of bridge circuit temperature at a predetermined point of the second programmable resistive divider circuit of that resistive channel, respectively;
  (e) emulating a bridge sensor output voltage corresponding to a selected one of the first number of conditions by coupling the voltage at the predetermined point of a corresponding selected one of the first programmable resistive divider circuits to a first output circuit to produce a first emulated bridge output voltage; and
  (f) emulating a bridge sensor temperature voltage corresponding to a selected one of the second number of bridge sensor temperature voltages by coupling the voltage at the predetermined point of a corresponding selected one of the second programmable resistive divider circuits to a second output circuit to produce an emulated bridge temperature voltage.

17. The method of claim 16 wherein the temperature-sensing device is a temperature-sensing resistor, wherein step (e) includes reducing the voltage across the first number of resistive channels by an amount equal to the emulated bridge temperature voltage.

18. The method of claim 16 including applying the analog sensor output voltage and the analog temperature voltage to corresponding inputs, respectively, of a sensor signal conditioning system.

19. A method for emulating a bridge sensor including a bridge circuit and a temperature-sensing device, an element of the bridge sensor being a transducer for receiving an applied stimulus, the method comprising:
  (a) providing a first number of stored voltage variables each corresponding to a different selected condition, wherein each condition includes a different combination of a selected applied stimulus level and a selected temperature of the bridge circuit;
  (b) programming each of the first number of stored voltage variables to emulate a bridge sensor voltage corresponding to a different one of the first number of conditions by setting that stored voltage variable to a voltage value representative of a first sensor output voltage for the bridge sensor to be emulated for each of the first number of conditions, respectively;
  (c) providing a second number of stored voltage variables each corresponding to a number of different selected temperatures of the bridge circuit equal to the second number;
  (d) programming each of the second number of stored voltage variables to emulate a different bridge circuit temperature voltage across the temperature-sensing device of the bridge sensor to be emulated by setting that stored voltage variable to a voltage value representative of the corresponding selected bridge circuit temperature;
  (e) emulating a bridge sensor output voltage corresponding to a selected one of the first number of conditions by converting a corresponding one of the stored voltage variables to an analog sensor output voltage representing the bridge sensor output voltage; and
  (f) emulating a bridge sensor temperature voltage corresponding to a selected one of the second number of bridge sensor temperature voltages by converting a corresponding one of the stored temperature voltage variables to an analog temperature voltage representing the bridge sensor temperature bridge temperature voltage.

20. The method of claim 19 including applying the analog sensor output voltage and the analog temperature voltage to corresponding inputs, respectively, of a sensor signal conditioning system.

* * * * *